US012738326B2

(12) United States Patent
Chen et al.

(10) Patent No.: US 12,738,326 B2
(45) Date of Patent: Sep. 15, 2026

(54) MEMORY SYSTEM, MEMORY DEVICE WITH TWO-STAGE BIT LINE CHARGING, AND OPERATION METHOD THEREOF

(71) Applicant: YANGTZE MEMORY TECHNOLOGIES CO., LTD., Wuhan (CN)

(72) Inventors: Teng Chen, Wuhan (CN); Weiwei He, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 116 days.

(21) Appl. No.: 18/743,956

(22) Filed: Jun. 14, 2024

(65) Prior Publication Data

US 2025/0246245 A1 Jul. 31, 2025

(30) Foreign Application Priority Data

Jan. 30, 2024 (CN) ........................ 202410130063.2

(51) Int. Cl.
*G11C 16/26* (2006.01)
*G11C 16/04* (2006.01)
*G11C 16/24* (2006.01)

(52) U.S. Cl.
CPC .......... *G11C 16/26* (2013.01); *G11C 16/0483* (2013.01); *G11C 16/24* (2013.01)

(58) Field of Classification Search
CPC ..... G11C 16/26; G11C 16/0483; G11C 16/24; G11C 16/32; G11C 16/08; G11C 16/12; G11C 16/30; G11C 16/34
See application file for complete search history.

(56) References Cited

U.S. PATENT DOCUMENTS 7,453,729 B2 * 11/2008 Lee ........................ G11C 16/24 365/185.11
2020/0168276 A1 * 5/2020 Yang .................. G11C 16/3427
2023/0056107 A1 * 2/2023 Yamada ............. G11C 16/3459

* cited by examiner

*Primary Examiner* — Pho M Luu
*Assistant Examiner* — Christopher Lane Reece
(74) *Attorney, Agent, or Firm* — Conley Rose, P.C.

(57) ABSTRACT

The present disclosure provides a memory device and an operation method thereof, and a memory system, wherein the memory device includes a memory array and a page buffer circuit coupled with a bit line in the memory array; the page buffer circuit includes a first charge circuit and a second charge circuit coupled to a first sensing node along with the first charge circuit; and the operation method of the memory device includes: in a first charge stage, charging the first sensing node to a first voltage through the first charge circuit; and in a second charge stage, charging the first sensing node and the bit line to a second voltage through the second charge circuit, wherein the second voltage is higher than the first voltage.

18 Claims, 10 Drawing Sheets

CURRENT

TIME

MEMORY SYSTEM, MEMORY DEVICE WITH TWO-STAGE BIT LINE CHARGING, AND OPERATION METHOD THEREOF

CROSS-REFERENCE TO RELATED APPLICATIONS

The present application claims priority to Chinese Patent Application No. 2024101300632, which was filed Jan. 30, 2024, is titled "MEMORY DEVICE AND OPERATION METHOD THEREOF, AND MEMORY SYSTEM," and is hereby incorporated herein by reference in its entirety.

TECHNICAL FIELD

The present disclosure relates to the technical field of semiconductor technology, and in particular to a memory device and an operation method thereof, and a memory system.

BACKGROUND

In order to meet the demand for the memory integration level, three-dimensional memories that comprise memory cells in a three-dimensional arrangement are proposed. As the memory integration level is further increased, the instantaneous peak current generated during operation of the memory increases accordingly, and thereby affecting the normal operation of the three-dimensional memory.

SUMMARY

In view of above, examples of the present disclosure provide a memory device and an operation method thereof, and a memory system, to solve at least one problem in the prior art.

In order to achieve the above objective, the technical solutions of the examples of the present disclosure are implemented as follows:

In a first aspect, examples of the present disclosure provide an operation method of a memory device, wherein the memory device comprises: a memory array; and a page buffer circuit coupled with a bit line in the memory array, wherein the page buffer circuit comprises: a first charge circuit; and a second charge circuit coupled to a first sensing node along with the first charge circuit, and wherein the operation method of the memory device comprises:

- in a first charge stage, charging the first sensing node to a first voltage through the first charge circuit; and
- in a second charge stage, charging the first sensing node and the bit line to a second voltage through the second charge circuit, wherein the second voltage is higher than the first voltage.

In an example, the first charge circuit comprises a clamp transistor connected with a power terminal and the first sensing node, and the charging the first sensing node to a first voltage through the first charge circuit comprises:

- in the first charge stage, applying a third voltage to a gate terminal of the clamp transistor to turn on the clamp transistor.

In an example, the second charge circuit comprises: a first transistor connected with the power terminal and a second sensing node; and a second transistor connected with the first sensing node and the second sensing node, and the charging the first sensing node to a second voltage through the second charge circuit comprises:

- in the second charge stage, applying a first pass voltage to a gate terminal of the first transistor to turn on the first transistor, and applying a second pass voltage to a gate terminal of the second transistor to turn on the second transistor.

In an example, the operation method of the memory device further comprises:

- in the first charge stage, applying the second pass voltage to the gate terminal of the second transistor to turn on the second transistor, and charging the second sensing node to the first voltage; and
- in the second charge stage, charging the second sensing node from the first voltage to the second voltage.

In an example, the operation method of the memory device further comprises:

- in the first charge stage, applying a fourth voltage to the gate terminal of the first transistor to turn off the first transistor.

In an example, the first charge circuit and the second charge circuit further comprise a third transistor connected with each of the power terminal, the clamp transistor, and the first transistor, and the operation method of the memory device further comprises:

- in the first charge stage and the second charge stage, applying a third pass voltage to a gate terminal of the third transistor to turn on the third transistor.

In an example, the operation method of the memory device further comprises:

- in the second charge stage, continuing to apply the third voltage to the gate terminal of the clamp transistor.

In an example, the second charge circuit comprises: a fourth transistor connected with the first sensing node; and a fifth transistor connected with the bit line and the fourth transistor, and the operation method of the memory device further comprises:

- in the first charge stage and the second charge stage, applying a ramp voltage to a gate terminal of the fourth transistor until the ramp voltage rises to a fourth pass voltage; and
- in the first charge stage and the second charge stage, applying a fifth pass voltage to a gate terminal of the fifth transistor to turn on the fifth transistor.

In a second aspect, examples of the present disclosure provide a memory device, comprising: a memory array; and a page buffer circuit coupled with a bit line in the memory array, wherein the page buffer circuit comprises:

- a first charge circuit, wherein a first terminal and a second terminal of the first charge circuit are connected with a power terminal and a first sensing node respectively, and the first charge circuit is configured to: in a first charge stage, charge the first sensing node to a first voltage; and
- a second charge circuit coupled to the first sensing node along with the first charge circuit, wherein a first terminal and a second terminal of the second charge circuit are connected with the power terminal and the bit line respectively, and the second charge circuit is configured to: in a second charge stage, charge the first sensing node and the bit line to a second voltage, wherein the second voltage is higher than the first voltage.

In an example, the first charge circuit comprises: a clamp transistor, wherein a first terminal and a second terminal of the clamp transistor are connected with the power terminal and the first sensing node respectively, and the memory device further comprises:

a control logic circuit configured to: in the first charge stage, apply a third voltage to a gate terminal of the clamp transistor to turn on the clamp transistor.

In an example, the second charge circuit comprises: a first transistor, wherein a first terminal and a second terminal of the first transistor are connected with the power terminal and the second sensing node respectively; and a second transistor, wherein a first terminal and a second terminal of the second transistor are connected with the second sensing node and the first sensing node respectively, and the control logic circuit is further configured to: in the second charge stage, apply a first pass voltage to a gate terminal of the first transistor to turn on the first transistor, and apply a second pass voltage to a gate terminal of the second transistor to turn on the second transistor.

In an example, the control logic circuit is further configured to: in the first charge stage, apply the second pass voltage to the gate terminal of the second transistor to turn on the second transistor, and charge the second sensing node to the first voltage; and in the second charge stage, charge the second sensing node from the first voltage to the second voltage.

In an example, the control logic circuit is further configured to: in the first charge stage, apply a fourth voltage to the gate terminal of the first transistor to turn off the first transistor.

In an example, the first charge circuit and the second charge circuit further comprise a third transistor, wherein a first terminal of the third transistor is connected with the power terminal, and a second terminal of the third transistor is connected with both the first terminal of the first transistor and the first terminal of the clamp transistor, and the control logic circuit is further configured to: in the first charge stage and the second charge stage, apply a third pass voltage to a gate terminal of the third transistor to turn on the third transistor.

In an example, the control logic circuit is further configured to: in the second charge stage, continue to apply the third voltage to the gate terminal of the clamp transistor.

In an example, the second charge circuit comprises: a fourth transistor, wherein a first terminal and a second terminal of the fourth transistor are connected with the first sensing node and a first terminal of a fifth transistor respectively; and the fifth transistor, wherein a second terminal of the fifth transistor is connected with the bit line, and the control logic circuit is further configured to: in the first charge stage and the second charge stage, apply a ramp voltage to a gate terminal of the fourth transistor until the ramp voltage rises to a fourth pass voltage; and in the first charge stage and the second charge stage, apply a fifth pass voltage to a gate terminal of the fifth transistor to turn on the fifth transistor.

In a third aspect, examples of the present disclosure provide a memory system, comprising: at least one memory device in any one of the above examples; and a controller coupled with the at least one memory device and configured to control the memory device.

In the technical solutions provided by the present disclosure, the operation method of the memory device comprises charging the bit line in stages, e.g., charging the first sensing node to the first voltage through the first charge circuit in the first charge stage and charging the first sensing node and the bit line to the second voltage through the second charge circuit in the second charge stage, wherein the second voltage is higher than the first voltage. As such, compared to a technical solution of charging the second sensing node to the second voltage directly, the operation method of the memory device provided by the present disclosure may divide a larger peak current into two smaller peak currents, thereby reducing the instantaneous peak current, lowering the degree of fluctuations of the power terminal voltage, and improving the reliability of the memory device.

DETAILED DESCRIPTION

Figure 1:
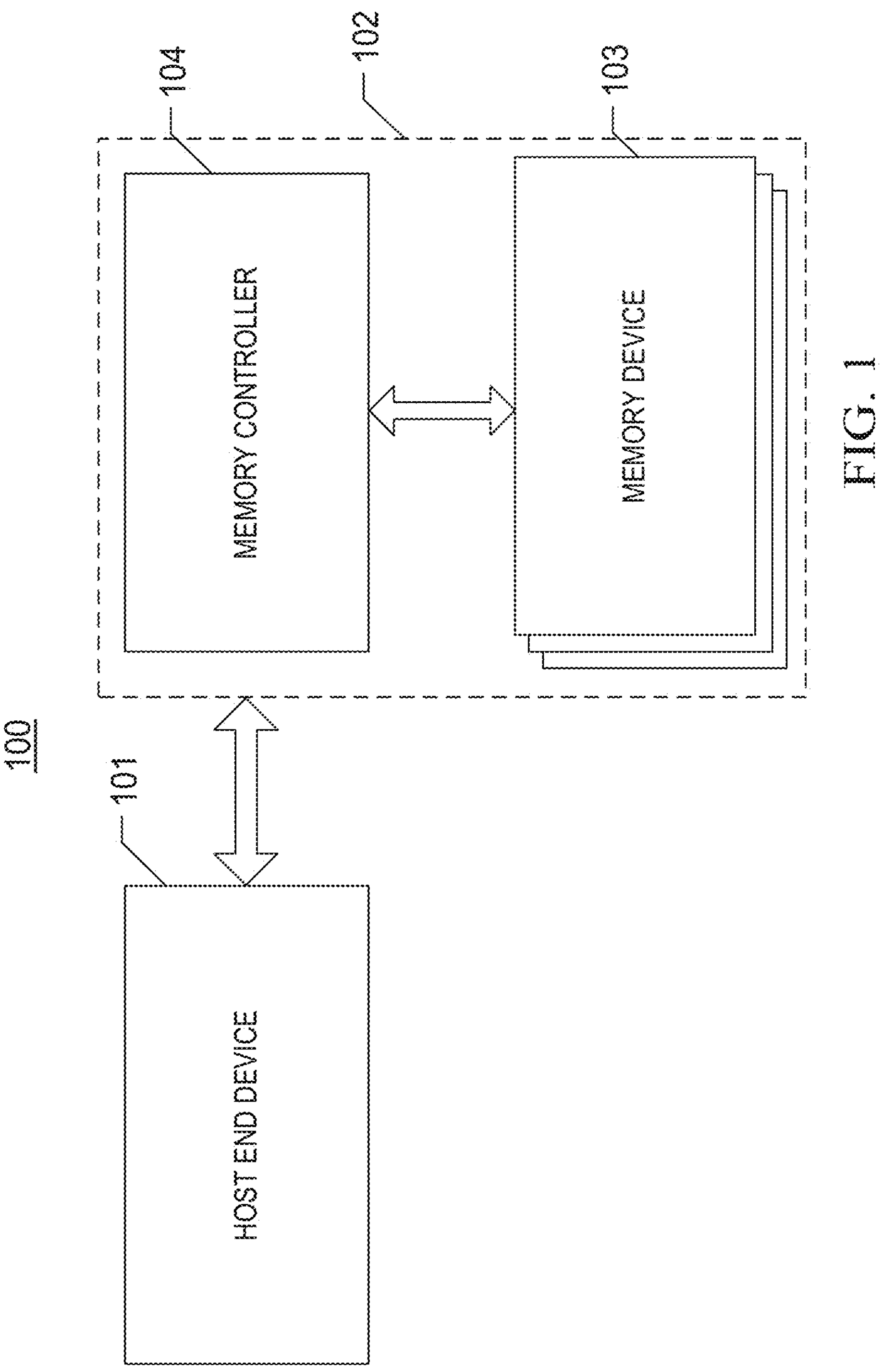
FIG. 1 is a schematic diagram of an example system having a memory system provided by examples of the present disclosure.

Examples disclosed in the present disclosure will be described in more detail below with reference to the accompanying drawings. Although examples of the present disclosure are shown in the drawings, it should be understood that the present disclosure may be implemented in various ways and should not be limited to the DETAILED DESCRIPTION set forth herein. These examples are provided so that the present disclosure can be more thoroughly understood and the scope disclosed in the present disclosure can be fully conveyed to those skilled in the art.

In the following description, numerous specific details are given in order to provide a more thorough understanding of the present disclosure. It will be apparent, however, to one skilled in the art that the present disclosure may be practiced without one or more of these details. In other examples, some technical features well-known in the art are not described to avoid confusion with the present disclosure; that is, not all features of the actual example are described here, and well-known functions and structures are not described in detail.

In the drawings, like reference numerals refer to like elements throughout.

It will be understood that, spatial relationship terms such as "under", "below", "beneath", "underneath", "on", "above" and so on, can be used here for convenience to describe the relationship between one element or feature and other elements or features shown in the figures. It will be understood that the spatially relationship terms also comprise different orientations of the device in use and operation in addition to the orientation depicted in the figures. For example, if the device in the figures is turned over, elements or features described as "below" or "underneath" or "under" other elements or features would then be oriented as "above" the other elements or features. Thus, the example terms "below" and "under" can comprise both orientations of above and below. The device may be otherwise oriented (rotated 90 degrees or at other orientations) and the spatial description terms used herein may be interpreted accordingly.

The terminology used herein is for the purpose of describing particular examples only and is not to be taken as a limitation of the present disclosure. As used herein, "a", "an" and "said/the" in singular forms are intended to include the plural forms as well, unless the context clearly dictates otherwise. It should also be understood that at least one of the terms "consists of" or "comprising", when used in this specification, identify the presence of at least one of stated features, integers, operations, elements or components, but do not exclude presence or addition of at least one of one or more other features, integers, operations, elements, components or groups. As used herein, the term "at least one of . . . " includes any and all combinations of the associated listed items.

The memory system in the examples of the present disclosure includes but is not limited to a memory system of a three-dimensional NAND type memory, and for ease of understanding, a memory system comprising a three-dimensional NAND type memory is used as an example for illustrating the memory system provided by the present disclosure.

FIG. 1 is a schematic diagram of an example system having a memory system provided by examples of the present disclosure. In the examples of the present disclosure, the system 100 can comprise a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having a memory therein. As shown in FIG. 1, system 100 can include a host end device 101 and a memory system 102 which may comprise one or more memory devices 103 and a memory controller 104. The host end device 101 can comprise a processor of an electronic device, such as a central processing unit (CPU), or a system-on-chip (SoC), such as an application processor (AP). The host end device 101 can be configured to send or receive data to or from the memory system 102.

In some examples, the memory controller 104 is coupled to the memory device 103 and the host end device 101 and is configured to control the memory device 103. The memory controller 104 can manage the data stored in memory device 103 and communicate with the host end device 101. In some examples, the memory controller 104 is designed for operating in a low duty-cycle environment such as secure digital cards, compact Flash cards (CFC), universal serial bus (USB) Flash drives, or other media for use in electronic devices, such as personal computers, digital cameras, mobile phones, etc. In some other examples, the memory controller 104 is designed for operating in a high duty-cycle environment such as solid state disks or embedded multi-media-cards (eMMCs).

In some examples, the memory controller 104 and one or more memory devices 103 can be integrated into various types of storage devices. That is, the memory system 102 can be implemented and packaged into different types of end electronic products.

Figure 3:
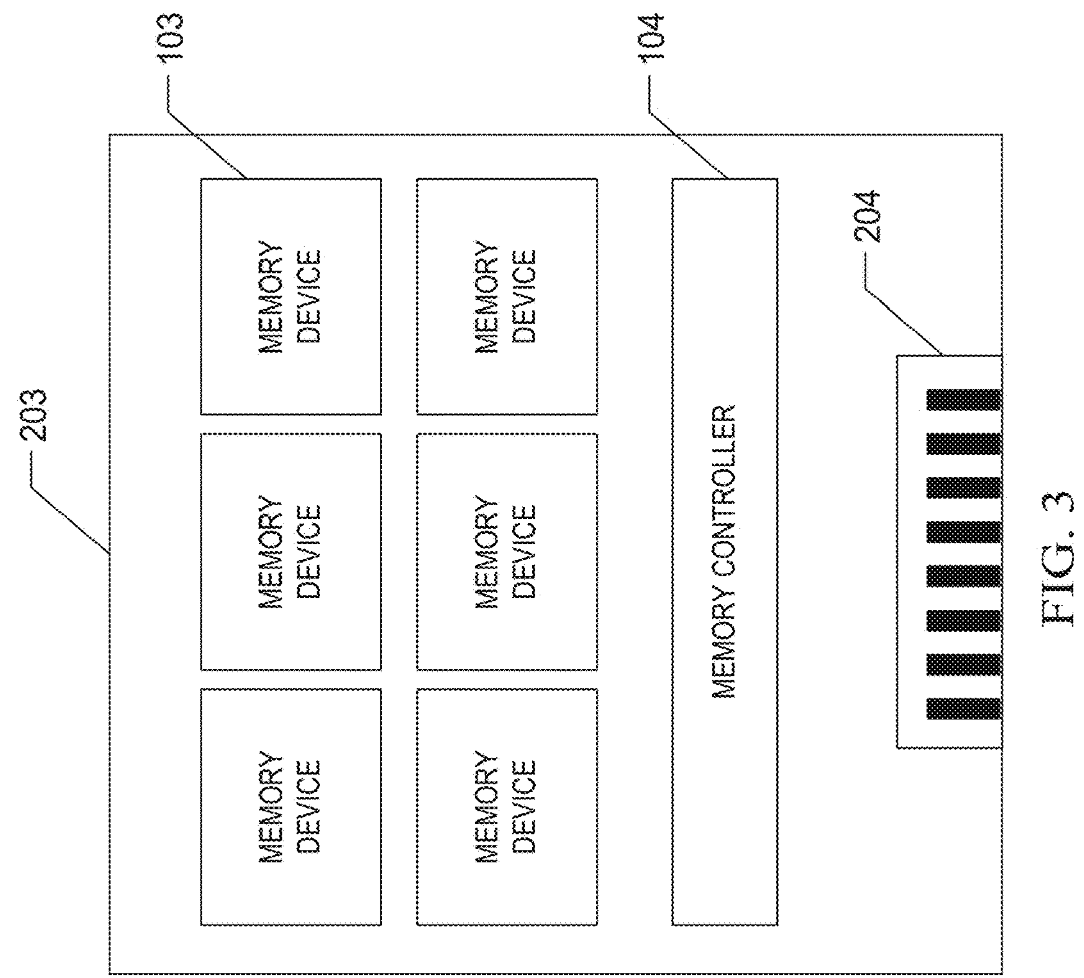
FIG. 3 is a schematic diagram of an example solid state drive having a memory system provided by examples of the present disclosure.
Figure 2:
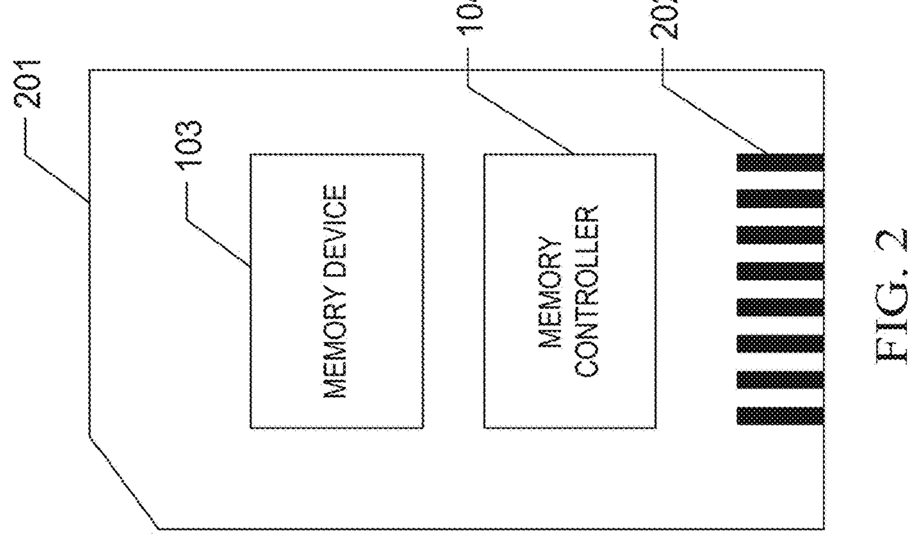
FIG. 2 is a schematic diagram of an example memory card having a memory system provided by examples of the present disclosure.

In an example shown in FIG. 2, the memory controller 104 and a single memory device 103 may be integrated into a memory card 201. The memory card 201 may comprise one of a compact flash card, a Smart Media Card (SMC), a Memory Stick (MS), a Multi-Media Card (MMC) such as RS-MMC, MMCmicro, and eMMC, etc., a secure digital card such as a Mini SD card, a Micro SD card, and an SDHC card, etc., or a universal flash card. The memory card 201 may further comprise a memory card connector 202 coupling the memory card 201 with the host end device (e.g., the host end device 101 in FIG. 1). In another example shown in FIG. 3, the memory controller 104 and a plurality of memory devices 103 may be integrated into an SSD 203. The SSD 203 may further comprise an SSD connector 204 coupling the SSD 203 with the host end device (e.g., the host end device 101 in FIG. 1). In some examples, at least one of the storage capacity or the operation speed of SSD 203 is greater than those of memory card 201.

Figure 4:
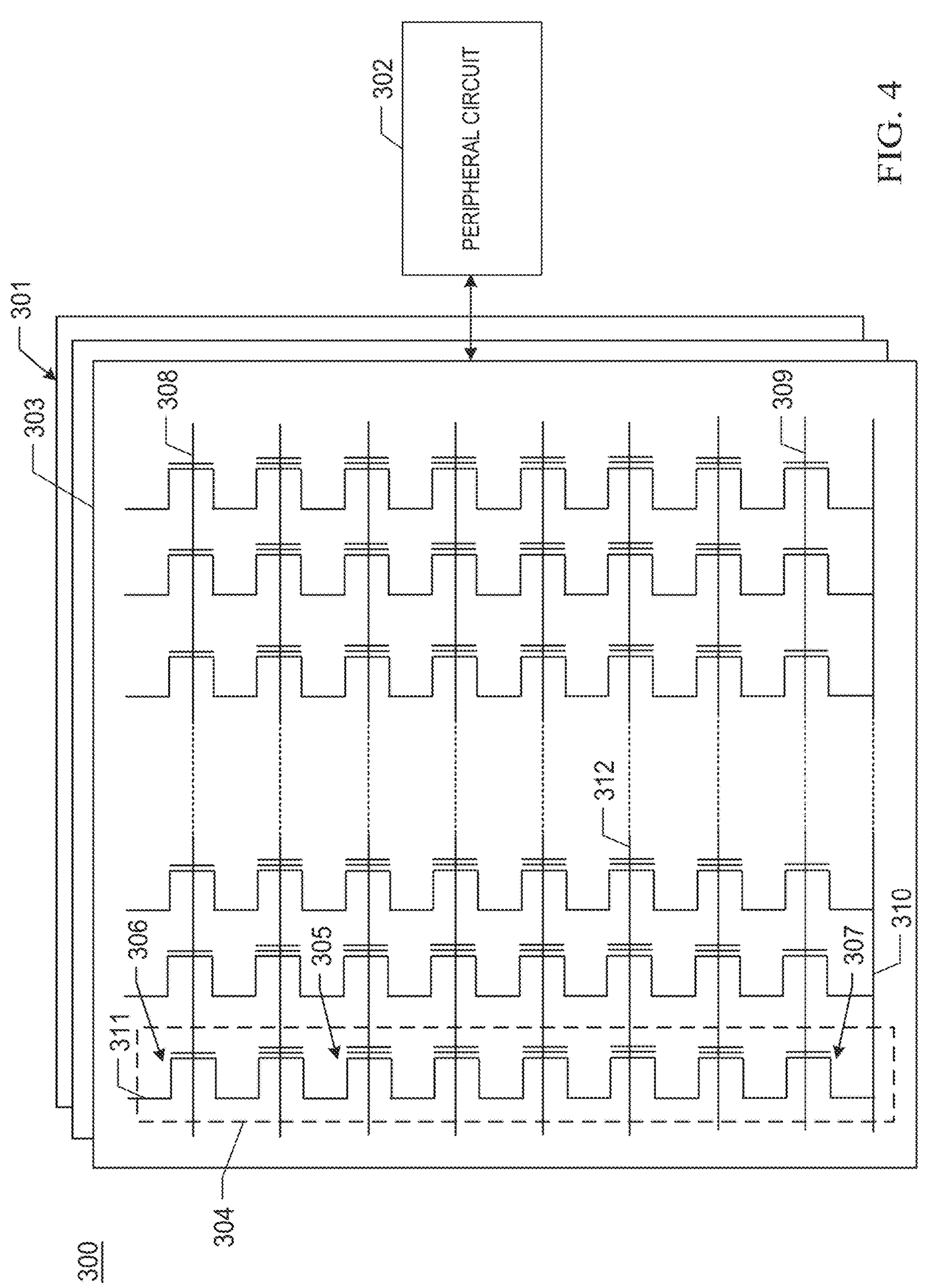
FIG. 4 is a schematic diagram of an example memory device comprising a peripheral circuit provided by examples of the present disclosure.

FIG. 4 is a schematic circuit diagram of an example memory device 300 comprising a peripheral circuit provided by examples of the present disclosure. The memory device 300 can be an example of the memory device 103 in FIG. 1. The memory device 300 can include a memory array 301 and a peripheral circuit 302 coupled to the memory array 301. The memory array 301 is illustrated as an example of a three-dimensional NAND type memory array, in which memory cells 305 are NAND memory cells and are provided in the form of an array of memory strings 304 each extending vertically above a substrate (not shown). In some examples, each memory string 304 includes a plurality of memory cells 305 coupled in series and stacked vertically. Each memory cell 305 can hold a continuous, analog value, such as an electrical voltage or charge, that depends on the number of electrons trapped within a region of the memory cell 305. Each memory cell 305 can comprise either a floating gate type of memory cell including a floating-gate transistor or a charge trap type of memory cell including a charge-trap transistor.

In some examples, each memory cell 305 is a single-level cell (SLC) that has two possible memory states and thus, can store one bit of data. For example, the first memory state "0" can correspond to a first range of voltages, and the second memory state "1" can correspond to a second range of voltages. In some examples, each memory cell 305 is a multi-level cell that is capable of storing more than a single bit of data in four or more memory states, such as a Multi-Level Cell (MLC) that stores two bits per cell, a Triple Level Cell (TLC) that stores three bits per cell, or a Quad-Level Cell (QLC) that stores four bits per cell.

As shown in FIG. 4, each memory string 304 may comprise a Bottom Select Transistor (BST) 307 at its source end and a Top Select Transistor (TST) 306 at its drain end. The bottom select transistor 307 and the top select transistor 306 can be configured to activate selected memory strings 304 during read and program operations. In some examples, the sources of memory strings 304 in the same block 303 can be coupled through a common source line (CSL) 310. For example, all memory strings 304 in the same block 303 have an array common source (ACS). Top select transistor 306 of each memory string 304 is coupled to a respective bit line (BL) 311 from which data can be read or written via an output bus (not shown), according to some examples. In some examples, each memory string 304 is configured to be selected or deselected by at least one of: applying a select voltage (e.g., a voltage above the threshold voltage of the top select transistor 306) or a deselect voltage (e.g., 0 V) to a top select gate (TSG) of a respective top select transistor 306 through one or more top select lines (TSL) 308 or applying a select voltage (e.g., a voltage above the threshold voltage of the bottom select transistor 307) or a deselect voltage (e.g., 0 V) to a bottom select gate (BSG) of a respective bottom select transistor 307 through one or more bottom select lines (BSL) 309.

As shown in FIG. 4, the memory strings 304 can be organized into multiple blocks 303, each of which can have a common source line 310. In some examples, each block 303 is the basic data unit for erase operations, e.g., all memory cells 305 on the same block 303 are erased at the same time. To erase memory cells 305 in a selected block, the common source line 310 coupled to the selected block as well as unselected blocks in the same plane as the selected block can be biased with an erase voltage. It is understood that in some examples, erase operation may be performed at a half-block level, a quarter-block level, or a level having any suitable number of blocks or any suitable fractions of a block. Memory cells 305 of adjacent memory strings 304 can be coupled through word lines 312 that select which row of memory cells 305 is affected by read or program operations.

In some examples, the peripheral circuit 302 can include any suitable analog, digital, and mixed-signal circuits for enabling the operations of the memory array 301 by applying and sensing at least one of voltage signals or current signals to and from each target memory cell 305 through bit lines 311, word lines 312, the common source line 310, bottom select lines 309, and top select lines 308. The peripheral circuit 302 can include various types of peripheral circuits formed using metal-oxide-semiconductor technologies.

Figure 5:
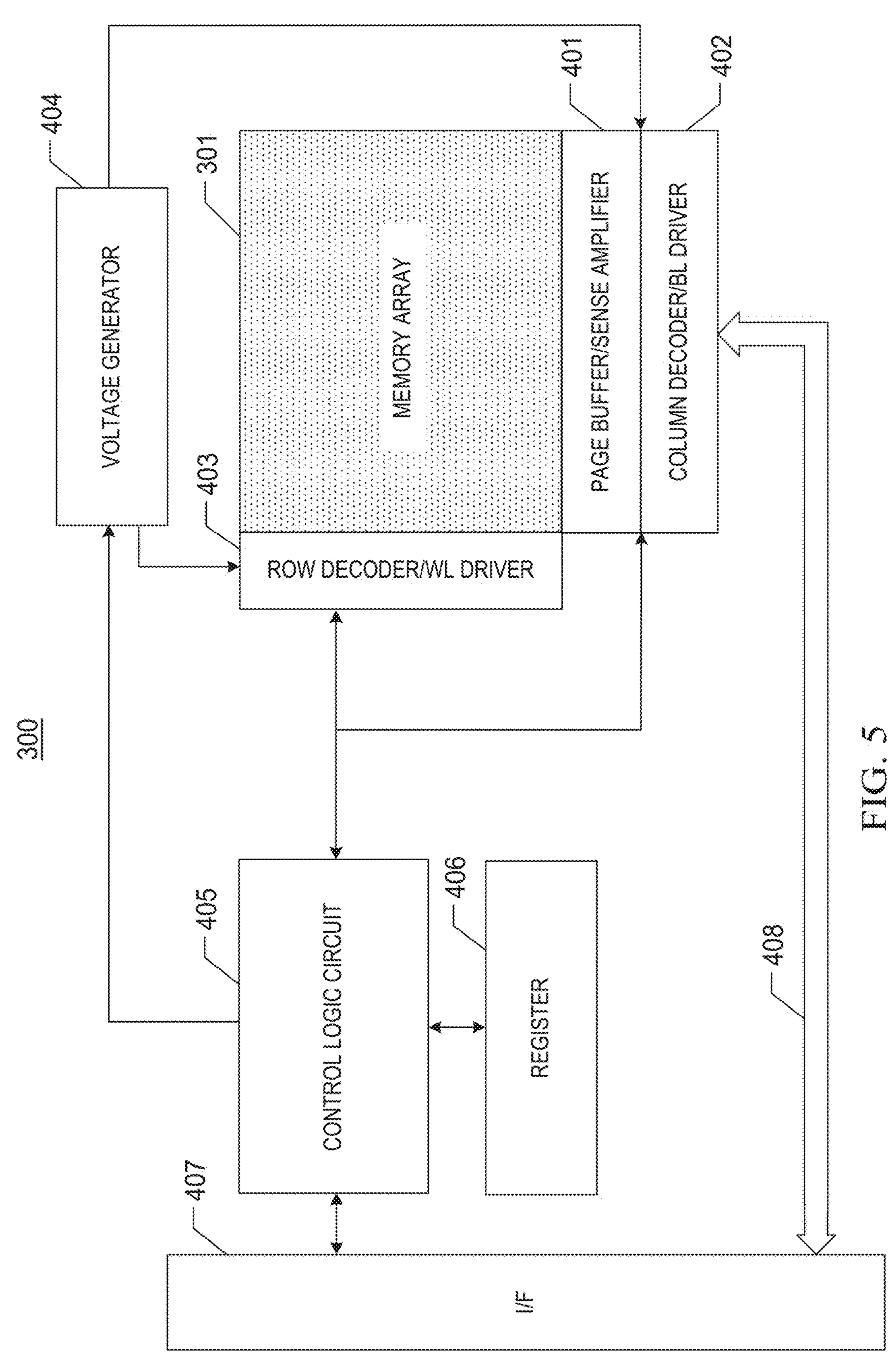
FIG. 5 is a schematic diagram of an example memory device comprising a memory array and a peripheral circuit provided by examples of the present disclosure.

FIG. 5 illustrates some example peripheral circuits, the peripheral circuit 302 including a page buffer/sense amplifier 401, a column decoder/bit line driver 402, a row decoder/word line driver 403, a voltage generator 404, a control logic circuit 405, a register group 406, a flash interface 407, and a data bus 408. It is understood that in some examples, additional peripheral circuits not shown in FIG. 5 may be included as well.

The page buffer/sense amplifier 401 may be configured to read and program (write) data from and to the memory array 301 according to control signals from the control logic circuit 405. In one example, the page buffer/sense amplifier 401 may store one page of program data (write data) to be programmed into the memory array 301. In another example, the page buffer/sense amplifier 401 may perform a program verification operation to ensure that the data has been properly programmed into the memory cell coupled to the selected word line. In yet another example, the page buffer/sense amplifier 401 may also sense low power signals from the bit line that represents data bits stored in the memory cells, and amplify the small voltage swing to recognizable logic levels in the read operation. The column decoder/bit line driver 402 may be configured to be controlled by the control logic circuit 405 and select one or more memory strings by applying bit line voltages generated from the voltage generator 404.

The row decoder/word line driver 403 may be configured to be controlled by the control logic circuit 405, select/deselect blocks of the memory array 301, and select/deselect the word lines of blocks. The row decoder/word line driver 403 may be further configured to drive word lines using word line voltages generated from the voltage generator 404. In some examples, the row decoder/word line driver 403 may also select/deselect and drive the bottom select line and the top select line. As described below in detail, the row decoder/word line driver 403 is configured to perform the program operations on the memory cells that are coupled to (one or more) selected word lines. The voltage generator 404 may be configured to be controlled by the control logic circuit 405 and generate the word line voltage (e.g., a read voltage, a program voltage, a pass voltage, a local voltage, and a verify voltage, etc.), the bit line voltage, and a source line voltage to be supplied to the memory array 301.

The control logic circuit 405 may be coupled to each peripheral circuit described above and is configured to control operations of each peripheral circuit. The register group 406 may be coupled to the control logic circuit 405 and include status registers, command registers, and address registers for storing status information, command operation codes (OP codes), and command addresses for controlling the operations of each peripheral circuit. The flash interface 407 may be coupled to the control logic circuit 405, and act as a control buffer to buffer and relay control commands received from a host end device (not shown) to the control logic circuit 405, and to buffer and relay status information received from the control logic circuit 405 to the memory system. The flash interface 407 may also be coupled to the column decoder/bit line driver 402 via the data bus 408 and act as a data I/O interface and data buffer to buffer and relay data to or from the memory array 301.

In some examples, during a program operation is performed on the memory array 301, after a memory cell is programmed to a preset threshold voltage, the page buffer circuit may apply a program inhibition voltage to a bit line connected with a memory cell string where the memory cell is located, and the program inhibition voltage may be, for example, a supply voltage VDD. In a later stage of the program operation, when the memory cells connected with the same word line are programmed to the preset threshold voltage, the program inhibition voltage is required to be applied to a plurality of bit lines at the same time, in which case a larger peak current may be generated. As the memory device integration level is further increased, the number of memory cells connected with the same word line increases accordingly, and the number of bit lines to which the program inhibition voltage is required to be applied increases in the later stage of the program operation, which may lead to larger fluctuations in the voltage of the power terminal, thereby affecting the normal operation of the memory device. Therefore, how to reduce the peak current generated during the program operation has become an urgent problem to be solved currently.

In this regard, the present disclosure provides the following examples.

Figure 6:
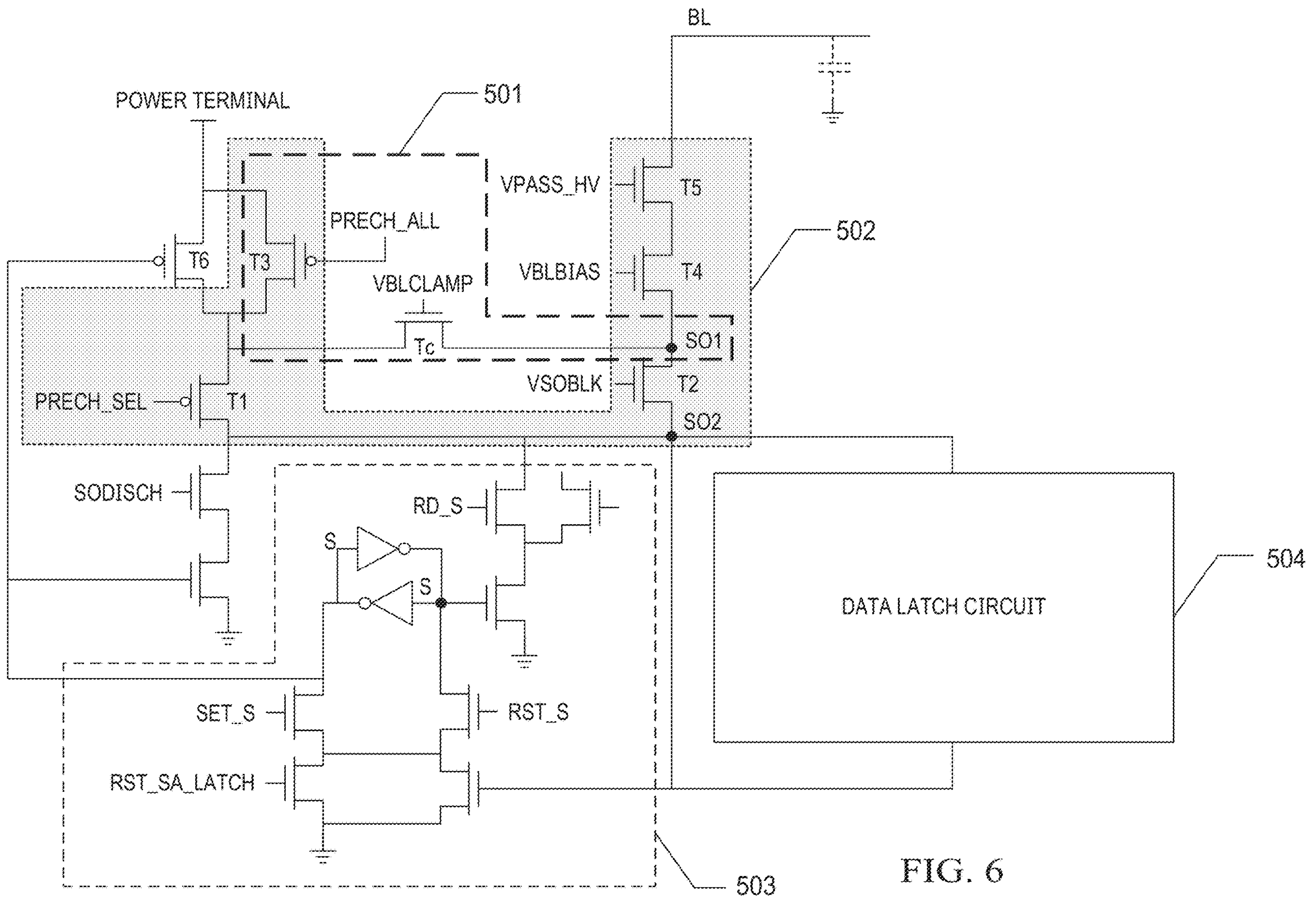
FIG. 6 is a circuit diagram of a page buffer circuit provided by examples of the present disclosure.

In some examples, FIG. 6 is a circuit diagram of the page buffer circuit provided by the examples of the present disclosure. As shown in FIG. 6, the page buffer circuit is coupled with the bit line BL, and the page buffer circuit comprises a first charge circuit 501 and a second charge circuit 502 coupled to a first sensing node SO1 along with the first charge circuit 501. The first charge circuit 501 comprises a third transistor T3 and a clamp transistor Tc, and the second charge circuit 502 comprises the third transistor T3, a first transistor T1, a second transistor T2, a fourth transistor T4, and a fifth transistor T5. Furthermore, the page buffer circuit may further comprise a sensing latch circuit 503 and a data latch circuit 504. The sensing latch circuit 503 may comprise a latch, which may be configured to store a sensing result of the program verification operation. The data latch circuit 504 may comprise a plurality of latches, which may be configured to store data to be written during the program operation, and the present disclosure does not impose limitations to a particular circuit structure of the data latch circuit 504.

Figure 7:
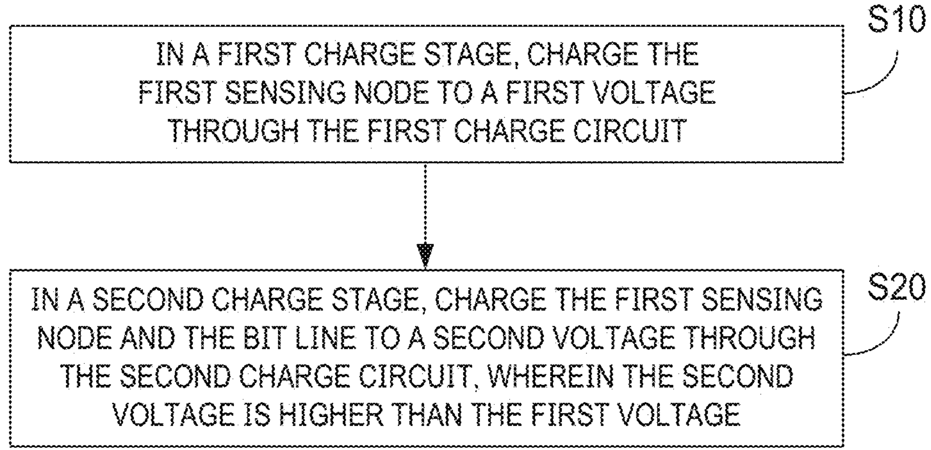
FIG. 7 is a flow diagram of an operation method of a memory device provided by examples of the present disclosure.

The present disclosure provides an operation method of a memory device. FIG. 7 is a flow diagram of the operation method of the memory device provided by examples of the present disclosure. As shown in FIG. 7, the operation method of the memory device comprises the following:

Operation S10: in a first charge stage, charging the first sensing node to a first voltage through the first charge circuit.

Operation S20: in a second charge stage, charging the first sensing node and the bit line to a second voltage through the second charge circuit, wherein the second voltage is higher than the first voltage.

Figure 8:
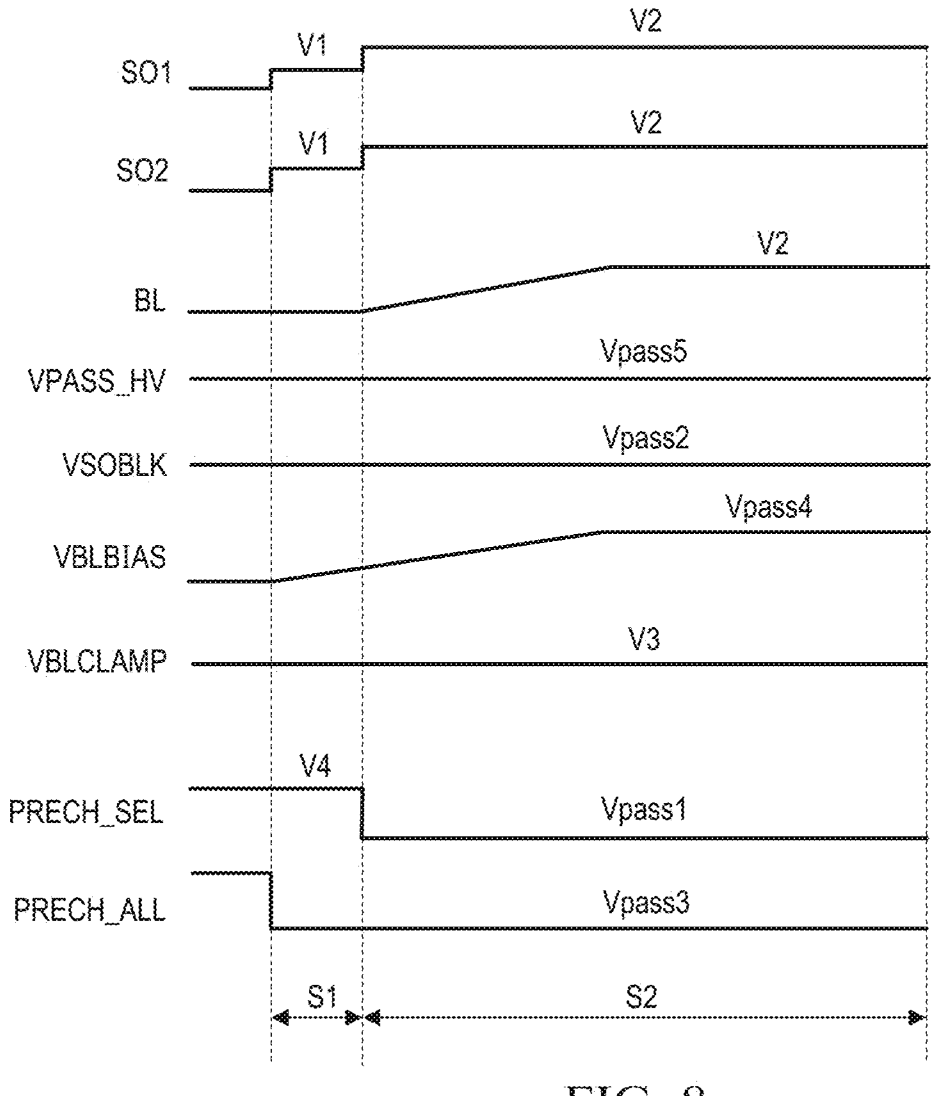
FIG. 8 illustrates voltage curves in charging bit lines provided by examples of the present disclosure.

FIG. 8 illustrates voltage curves in charging the bit lines provided by examples of the present disclosure. The operation method of the memory device provided by the present disclosure will be described below in detail in connection with FIGS. 6, 7, and 8.

It is to be noted that the following description is only an example of charging one bit line connected with one page buffer circuit through the page buffer circuit. It may be understood that the memory device may comprise a plurality of page buffer circuits as shown in FIG. 6, and bit lines connected with the plurality of page buffer circuits may be charged at the same time during the program operation. Here, each of the bit lines may comprise a bit line connected with a memory cell string where the memory cell that have passed the program verification is located.

In some examples, as shown in FIG. 6, the first charge circuit 501 comprises a clamp transistor Tc connected with the power terminal and the first sensing node SO1. In connection with FIGS. 6 to 8, a particular process of performing operation S10 may comprise: in the first charge stage S1, applying a third voltage V3 to a gate terminal of the clamp transistor Tc to turn on the clamp transistor Tc.

In some examples, as shown in FIG. 6, the first charge circuit 501 comprises a third transistor T3 connected with the power terminal and the clamp transistor Tc. In connection with FIGS. 6 to 8, the operation method of the memory device further comprises: in the first charge stage S1, applying a third pass voltage Vpass3 to a gate terminal of the third transistor T3 to turn on the third transistor T3.

In some examples, in the first charge stage S1, when the third transistor T3 and the clamp transistor Tc are both turned on, the first sensing node SO1 may be charged to the first voltage V1 through the first charge circuit 501.

In the examples of the present disclosure, the clamp transistor Tc is controlled by a control signal VBLCLAMP, the third transistor T3 is controlled by a control signal PRECH_ALL, the third voltage V3 comprises a voltage value of the control signal VBLCLAMP in the first charge stage S1, and the third pass voltage Vpass3 comprises a voltage value of the control signal PRECH_ALL in the first charge stage S1.

In some particular examples, the clamp transistor Tc comprises a source-follower transistor, and a voltage output from a terminal of the clamp transistor Tc that is connected with the first sensing node SO1 is equal to a difference between the third voltage V3 and a threshold voltage Vth of the clamp transistor Tc, e.g., V3−Vth. Thus, in the first charge stage S1, the first sensing node SO1 may be charged to the first voltage V1, and the first voltage V1 may be equal to V3−Vth.

In some particular examples, the third voltage V3 is less than a sum of the supply voltage VDD and the threshold voltage Vth of the clamp transistor Tc, e.g., V3<VDD+Vth. Thus, in the first charge stage S1, the first sensing node SO1 may be charged to the first voltage V1, and the first voltage V1 is less than the supply voltage VDD. That is, in the examples of the present disclosure, the first sensing node SO1 may be charged first to the first voltage V1 that is less than the supply voltage VDD using a potential clamp function of the clamp transistor Tc.

In a particular example, the third voltage V3 is equal to a difference between the supply voltage VDD and the threshold voltage Vth of the clamp transistor Tc, e.g., VDD−Vth. Thus, in the first charge stage S1, the first sensing node SO1 may be charged to the first voltage V1, and the first voltage V1 may be equal to VDD−2Vth.

In some particular examples, the third transistor T3 may comprise a PMOS transistor, and the third pass voltage Vpass3 may be equal to a ground voltage Vss.

In some examples, the operation method of the memory device further comprises: in the first charge stage S1, applying a second pass voltage Vpass2 to a gate terminal of a second transistor T2 to turn on the second transistor T2.

In the examples of the present disclosure, the second transistor T2 is controlled by a control signal VSOBLK, and the second pass voltage Vpass2 comprises a voltage value of the control signal VSOBLK in the first charge stage S1.

In some particular examples, the second transistor T2 may comprise an NMOS transistor, and the second pass voltage Vpass2 may be equal to V2X, which may be twice the supply voltage VDD in magnitude.

In some examples, the operation method of the memory device further comprises: in the first charge stage S1, applying a fourth voltage V4 to the gate terminal of the first transistor T1 to turn off the first transistor T1.

In the examples of the present disclosure, the first transistor T1 is controlled by a control signal PRECH_SEL, and the fourth voltage V4 comprises a voltage value of the control signal PRECH_SEL in the first charge stage S1. In the first charge stage S1, the second transistor T2 is turned on and the first transistor T1 is turned off, so that the second sensing node SO2 may be also charged to the first voltage V1.

In some particular examples, the first transistor T1 may comprise a PMOS transistor, and the fourth voltage V4 may be equal to the supply voltage VDD.

In some examples, the operation method of the memory device further comprises: in the first charge stage S1, applying a ramp voltage to a gate terminal of the fourth transistor T4, and applying a fifth pass voltage Vpass5 to a gate terminal of the fifth transistor T5 to turn on the fifth transistor T5.

In the examples of the present disclosure, the fourth transistor T4 is controlled by a control signal VBLBIAS, and in the first charge stage S1, a voltage value of the control signal VBLBIAS is a ramp voltage with a constant ramp-up rate, in which stage the fifth transistor T5 remains in an turned-off state. The fifth transistor T5 is controlled by a control signal VPASS_HV, and the fifth pass voltage Vpass5 comprises a voltage value of the control signal VPASS_HV in the first charge stage S1.

In some particular examples, the fifth transistor T5 may comprise an NMOS transistor, and the fifth pass voltage Vpass5 may be equal to V2X.

Figure 9:
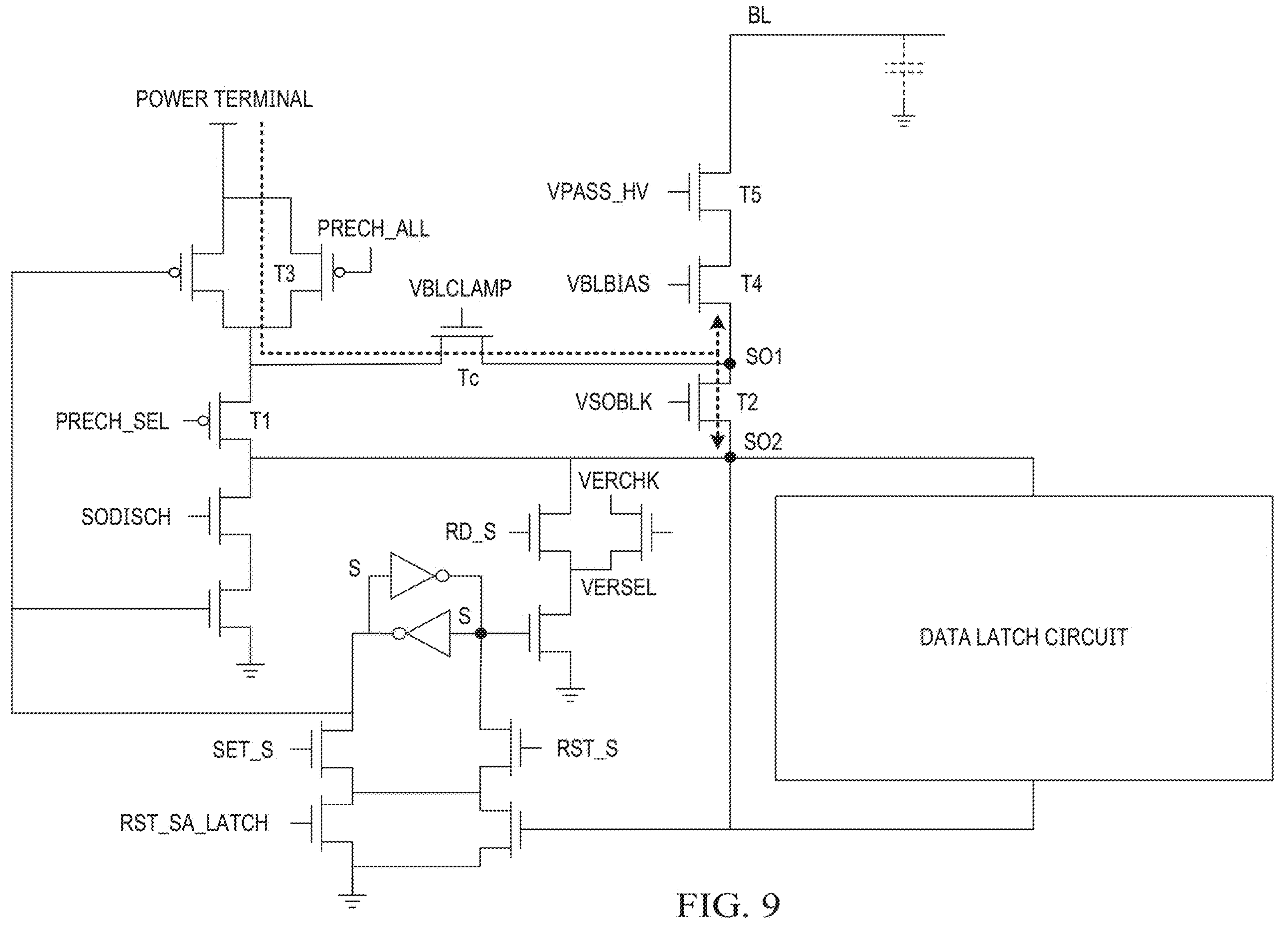
FIG. 9 is a schematic diagram of a current path for a first charge stage provided by examples of the present disclosure.

In some particular examples, a dashed line in FIG. 9 illustrates a current path for the first charge stage S1. In connection with FIGS. 6, 8, and 9, in the first charge stage S1, the first charge circuit 501 between the power terminal and the first sensing node SO1 may form a pathway, and a pathway may be also formed between the first sensing node SO1 and the second sensing node SO2. As such, the first sensing node SO1 and the second sensing node SO2 may be charged to the first voltage V1. Since the magnitude of the first voltage V1 depends on the magnitude of the third voltage V3 applied to the gate terminal of the clamp transistor Tc, and the third voltage V3 is less than the sum of the supply voltage VDD and the threshold voltage Vth of the clamp transistor Tc, the first voltage V1 is less than the supply voltage VDD, that is, in the first charge stage, the first sensing node SO1 and the second sensing node SO2 both may be charged to the first voltage V1 that is less than the supply voltage VDD.

In some examples, in connection with FIGS. 6 and 8, a particular process of performing operation S20 may comprise: in the second charge stage S2, applying the first pass voltage Vpass1 to the gate terminal of the first transistor T1 to turn on the first transistor T1, and continuing to apply the second pass voltage Vpass2 to the gate terminal of the second transistor T2 to maintain the second transistor T2 in a turned-on state.

In some particular examples, the first transistor T1 may comprise a PMOS transistor, and the first pass voltage Vpass1 may be equal to the ground voltage Vss.

In some examples, the operation method of the memory device further comprises: in the second charge stage S2, continuing to apply the third pass voltage Vpass3 to the gate terminal of the third transistor T3 to maintain the third transistor T3 in a turned-on state; continuing to apply the third voltage V3 to the gate terminal of the clamp transistor Tc to maintain the clamp transistor Tc in a turned-on state; continuing to apply the ramp voltage to the gate terminal of the fourth transistor T4 until the ramp voltage rises to a fourth pass voltage Vpass4; and continuing to apply the fifth pass voltage Vpass5 to the gate terminal of the fifth transistor T5 to maintain the fifth transistor T5 in a turned-on state.

Figure 10:
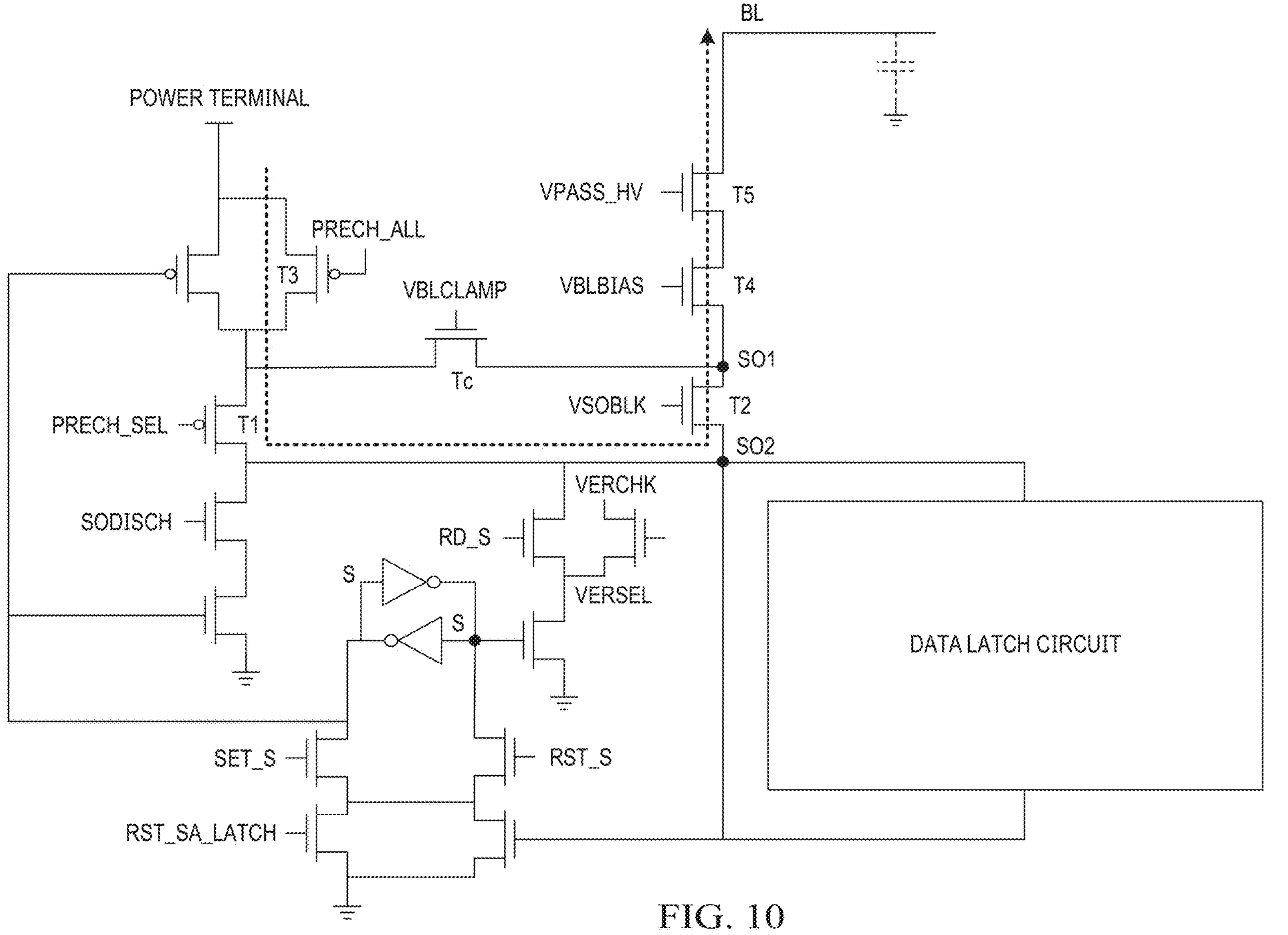
FIG. 10 is a schematic diagram of a current path for a second charge stage provided by examples of the present disclosure.

In some particular examples, a dashed line in FIG. 10 illustrates a current path for the second charge stage S2. In connection with FIGS. 6, 8, and 10, in the second charge stage S2, the second charge circuit 502 between the bit line BL and the power terminal may form a pathway, so that the first sensing node SO1, the second sensing node SO2, and the bit line BL may be all charged to the second voltage V2. Here, the second voltage V2 may be equal to the supply voltage VDD, and may serve as the program inhibition voltage.

In the examples of the present disclosure, when the program inhibition voltage is required to be applied to the bit line, a charge process may be divided into two charge stages. In the first charge stage S1, the first sensing node SO1 may be charged to the first voltage V1 that is less than the supply voltage VDD through the first charge circuit 501 in the page buffer circuit, and in the second charge stage S2, the first sensing node SO1 and the bit line BL may be both charged to the second voltage V2 through the second charge circuit 502 in the page buffer circuit.

Figures 11, 12:
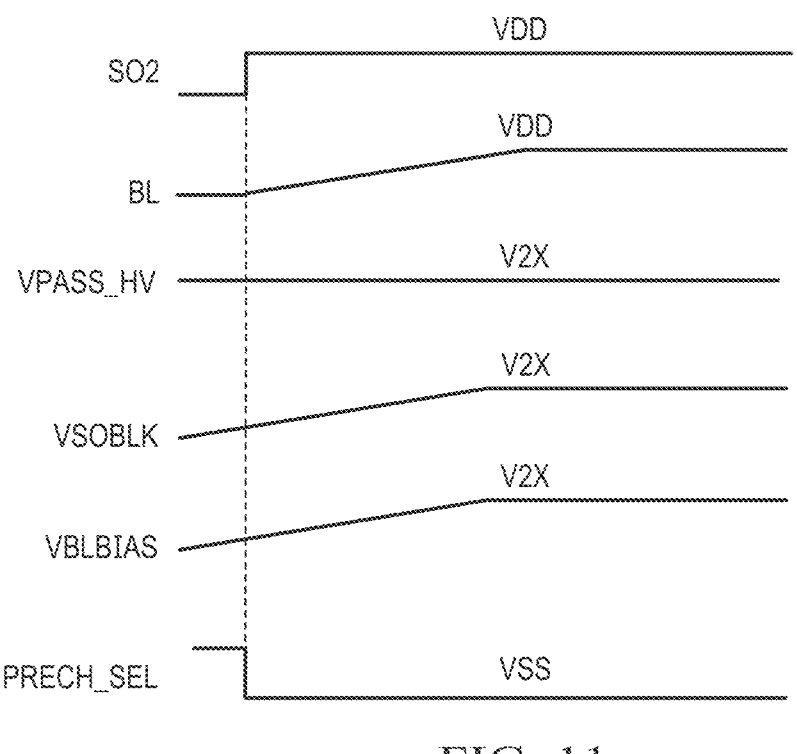
FIG. 11 illustrates voltage curves in charging bit lines provided by some other examples.
FIG. 12 illustrates current curves of a power terminal in use of two different charge solutions for charging bit lines provided by examples of the present disclosure.

FIG. 11 illustrates voltage curves in charging the bit lines provided by some other examples. In connection with FIGS. 6 and 11, a sixth transistor T6 connected with the power terminal comprises a PMOS transistor, wherein a gate of the sixth transistor T6 is connected with the sensing latch circuit 503 and is controlled by program inhibition information latched by the sensing latch circuit 503. When the program inhibition voltage is required to be applied to the bit line BL, the program inhibition information latched by the sensing latch circuit 503 comprises a logic low level, so as to turn on the sixth transistor T6. At the same time, the ground voltage Vss is applied to the gate terminal of the first transistor T1 to turn on the first transistor T1, so that the second sensing node SO2 may be charged directly to the supply voltage VDD. Then the second transistor T2, the fourth transistor T4 and the fifth transistor T5 are turned on, so that the bit line BL may be charged to the supply voltage VDD. During the above process, in order to prevent a damage to transistors that is caused by an excessively rapid rise of the voltage in the charge circuit, the ramp voltage with the constant ramp-up rate is required to be applied to gate terminals of the second transistor T2 and the fourth transistor T4, until the ramp voltage rises to V2X, thereby suppressing a coupling effect.

FIG. 12 illustrates current curves of the power terminal in use of the above two different charge solutions for charging the same number of bit lines, wherein a solid line is a current curve of the power terminal in charging the bit lines using a charge solution provided by some other examples, and a dashed line is a current curve of the power terminal in charging the bit lines using a charge solution provided by examples of the present disclosure. As shown in FIG. 12, in charging of the bit line using the charge solution provided by some other examples, the second sensing node SO2 is charged directly to the supply voltage VDD, thus generating a large peak current, whereas in charging of the bit line using the charge solution provided by the examples of the present disclosure, since the charge process is divided into two stages, two smaller peak currents may be generated at the power terminal. That is, the operation method of the memory device provided by the examples of the present disclosure may implement the division of the peak current, thereby reducing the instantaneous peak current, lowering the degree of fluctuations of the power terminal voltage, and improving the reliability of the memory device.

Furthermore, in connection with FIGS. 6, 8, and 11, in the examples of the present disclosure, since the charge process is divided into two stages, and the charge voltage in the first charge stage S1 may be clamped at the first voltage V1 that is less than the supply voltage VDD by the third voltage V3 applied to the gate terminal of the clamp transistor Tc, the degree of voltage fluctuations is low in both of the charge stages. As such, the ramp voltage is no longer required to be applied to the gate terminal of the second transistor T2, and the ramp-up rate of the ramp voltage applied to the gate terminal of the fourth transistor T4 may be increased, thereby reducing power consumption to a certain extent and shortening program time.

Based on an idea similar to that of the operation method of the memory device described above, the present disclosure further provides a memory device. In connection with FIGS. 5, 6, and 8, the memory device comprises a memory array 301 and a page buffer circuit coupled with a bit line BL in the memory array 301. The page buffer circuit comprises: a first charge circuit 501, wherein a first terminal and a second terminal of the first charge circuit 501 are connected with a power terminal and a first sensing node SO1 respectively, and is configured to: in a first charge stage S1, charge the first sensing node SO1 to a first voltage V1; and a second charge circuit 502 coupled to the first sensing node SO1 along with the first charge circuit 501, wherein a first terminal and a second terminal of the second charge circuit 502 are connected with the power terminal and the bit line BL respectively, and is configured to: in a second charge stage S2, charge the first sensing node SO1 and the bit line BL to a second voltage V2, wherein the second voltage V2 is higher than the first voltage V1.

In some particular examples, referring to FIG. 5, the memory device further comprises: a control logic circuit 405, wherein the control logic circuit 405 may be configured to send a control signal to the voltage generator 404, and then the voltage generator 404 sends a control signal having a particular voltage value to the page buffer circuit, so as to control the page buffer circuit.

In some examples, in connection with FIGS. 5, 6, and 8, the first charge circuit 501 comprises a clamp transistor Tc, wherein a first terminal and a second terminal of the clamp transistor Tc are connected with the power terminal and the first sensing node SO1 respectively. The control logic circuit 405 is configured to: in the first charge stage S1, apply a third voltage V3 to a gate terminal of the clamp transistor Tc to turn on the clamp transistor Tc.

In some particular examples, the clamp transistor Tc comprises a source-follower transistor, and a voltage output from a terminal of the clamp transistor Tc that is coupled with the first sensing node SO1 is equal to a difference between the third voltage V3 and a threshold voltage Vth of the clamp transistor Tc. The third voltage V3 is less than a sum of the supply voltage VDD and the threshold voltage Vth of the clamp transistor Tc, and the first voltage V1 is less than the supply voltage VDD.

In some examples, in connection with FIGS. 5, 6, and 8, the second charge circuit 502 comprises a first transistor T1 and a second transistor T2; a first terminal and a second terminal of the first transistor T1 are connected with the power terminal and the second sensing node SO2 respectively, and a first terminal and a second terminal of the second transistor T2 are connected with the second sensing node SO2 and the first sensing node SO1 respectively. The control logic circuit 405 is further configured to: in the second charge stage S2, apply a first pass voltage Vpass1 to a gate terminal of the first transistor T1 to turn on the first transistor T1, and apply a second pass voltage Vpass2 to a gate terminal of the second transistor T2 to turn on the second transistor T2.

In some particular examples, the first transistor T1 may comprise a PMOS transistor, and the first pass voltage Vpass1 may be equal to the ground voltage Vss; the second transistor T2 may comprise an NMOS transistor, and the second pass voltage Vpass2 may be equal to V2X, which may be twice the supply voltage VDD in magnitude.

In some examples, in connection with FIGS. 5, 6, and 8, the control logic circuit 405 is further configured to: in the first charge stage S1, apply the second pass voltage Vpass2 to the gate terminal of the second transistor T2 to turn on the second transistor T2, and charge the second sensing node SO2 to the first voltage V1; and in the second charge stage S2, charge the second sensing node SO2 from the first voltage V1 to the second voltage V2.

In some examples, in connection with FIGS. 5, 6, and 8, the control logic circuit 405 is further configured to: in the first charge stage S1, apply a fourth voltage V4 to the gate terminal of the first transistor T1 to turn off the first transistor T1.

In some particular examples, the first transistor T1 may comprise a PMOS transistor, and the fourth voltage V4 may be equal to the supply voltage VDD.

In some examples, in connection with FIGS. 5, 6, and 8, the first charge circuit 501 and the second charge circuit 502 may further comprise a third transistor T3, wherein a first terminal of the third transistor T3 is connected with the power terminal, and a second terminal of the third transistor T3 is connected with both the first terminal of the first transistor T1 and the first terminal of the clamp transistor Tc. The control logic circuit 405 is further configured to: in the first charge stage S1 and the second charge stage S2, apply a third pass voltage Vpass3 to a gate terminal of the third transistor T3 to turn on the third transistor T3.

In some particular examples, the third transistor T3 may comprise a PMOS transistor, and the third pass voltage Vpass3 may be equal to a ground voltage Vss.

In some examples, in connection with FIGS. 5, 6, and 8, the control logic circuit 405 is further configured to: in the second charge stage S2, continue to apply the third voltage V3 to the gate terminal of the clamp transistor Tc.

In some examples, in connection with FIGS. 5, 6, and 8, the second charge circuit 502 comprises a fourth transistor T4 and a fifth transistor T5, wherein a first terminal and a second terminal of the fourth transistor T4 are connected with the first sensing node SO1 and a first terminal of the fifth transistor T5 respectively, and a second terminal of the fifth transistor T5 is connected with the bit line BL. The control logic circuit 405 is further configured to: in the first charge stage S1 and the second charge stage S2, apply a ramp voltage to a gate terminal of the fourth transistor T4 until the ramp voltage rises to a fourth pass voltage Vpass4; and in the first charge stage S1 and the second charge stage S2, apply a fifth pass voltage Vpass5 to a gate terminal of the fifth transistor T5 to turn on the fifth transistor T5.

In some particular examples, the fourth transistor T4 and the fifth transistor T5 may both comprise NMOS transistors, and the fourth pass voltage Vpass4 and the fifth pass voltage Vpass5 may be equal to V2X.

In the examples of the present disclosure, the control logic circuit may be configured to divide the charge process of the bit line into two charge stages, wherein in the first charge stage, the first sensing node and the second sensing node are charged to the first voltage that is less than the supply voltage through the first charge circuit, using the clamp function of the clamp transistor; in the second charge stage, the first sensing node, the second sensing node, and the bit line are charged to the second voltage through the second charge circuit. As such, the division of the peak current may be implemented during the program process, that is, the larger peak current generated during the process of charging the bit line to the program inhibition voltage is divided into two smaller peak currents, thereby reducing the instantaneous peak current, lowering the degree of fluctuations of the power terminal voltage, and improving the reliability of the memory device.

Based on an idea similar to that of the above memory device, the present disclosure further provides a memory system. The memory system comprises: at least one memory device in any one of the aforementioned examples; and a controller coupled with the at least one memory device and configured to control the memory device. Specific compositions and functional examples of the memory system may be referred to the preceding descriptions of FIGS. 1 to 5, which are no longer repeated here for briefness.

The methods disclosed in several method examples as provided by the present disclosure may be combined freely to obtain new method examples in case of no conflicts.

The features disclosed in several device examples provided by the present disclosure may be combined freely to obtain new device examples in case of no conflicts.

The above descriptions are merely examples of the present disclosure, and the protection scope of the present disclosure is not limited to these. Any variation or replacement that may be readily figured out by those skilled in the art within the technical scope disclosed by the present disclosure shall fall within the protection scope of the present disclosure.

What is claimed is:

1. A method of operating a memory device, comprising:

in a first charge stage, charging a first sensing node to a first voltage through a first charge circuit by applying a third voltage to a gate terminal of a clamp transistor to turn on the clamp transistor, wherein the first charge circuit comprises the clamp transistor connected to a power terminal and the first sensing node, wherein the memory device comprises the first charge circuit and a second charge circuit coupled to the first sensing node along with the first charge circuit; and in a second charge stage, charging the first sensing node and a bit line coupled to the first sensing node to a second voltage through the second charge circuit by applying a first pass voltage to a gate terminal of a first transistor to turn on the first transistor and applying a second pass voltage to a gate terminal of a second transistor to turn on the second transistor, wherein the second voltage is higher than the first voltage, and wherein the second charge circuit comprises the first transistor connected to the power terminal and a second sensing node and the second transistor connected to the first sensing node and the second sensing node.

2. The method of claim 1, further comprising:

in the first charge stage, applying the second pass voltage to the gate terminal of the second transistor to turn on the second transistor, and charging the second sensing node to the first voltage; and in the second charge stage, charging the second sensing node from the first voltage to the second voltage.

3. The method of claim 1, further comprising:

in the first charge stage, applying a fourth voltage to the gate terminal of the first transistor to turn off the first transistor.

4. The method of claim 1, further comprising:

in the first charge stage and the second charge stage, applying a third pass voltage to a gate terminal of a third transistor to turn on the third transistor, wherein the first charge circuit comprises the third transistor connected to the power terminal and the first transistor.

5. The method of claim 1, further comprising:

in the second charge stage, continuing to apply the third voltage to the gate terminal of the clamp transistor.

6. The method of claim 1, wherein the second charge circuit comprises:

a fourth transistor connected with the first sensing node; and a fifth transistor connected with the bit line and the fourth transistor, and the method further comprising:

in the first charge stage and the second charge stage, applying a ramp voltage to a gate terminal of the fourth transistor until the ramp voltage rises to a fourth pass voltage; and in the first charge stage and the second charge stage, applying a fifth pass voltage to a gate terminal of the fifth transistor to turn on the fifth transistor, wherein the second charge circuit comprises the fourth transistor connected to the first sensing node; and the fifth transistor connected to the bit line and the fourth transistor.

7. A memory device, comprising:

a memory array; and a page buffer circuit coupled to a bit line in the memory array, wherein the page buffer circuit comprises:

a first charge circuit, wherein a first terminal and a second terminal of the first charge circuit are connected to a power terminal and a first sensing node respectively, and the first charge circuit is configured to:

in a first charge stage, charge the first sensing node to a first voltage by applying a third voltage to a gate terminal of a clamp transistor to turn on the clamp transistor, wherein the first charge circuit comprises the clamp transistor connected to a power terminal and the first sensing node; and a second charge circuit coupled to the first sensing node along with the first charge circuit, wherein a first terminal and a second terminal of the second charge circuit are connected to the power terminal and the bit line respectively, and the second charge circuit is configured to:

in a second charge stage, charge the first sensing node and the bit line to a second voltage by applying a first pass voltage to a gate terminal of a first transistor to turn on the first transistor and applying a second pass voltage to a gate terminal of a second transistor to turn on the second transistor, wherein the second voltage is higher than the first voltage, and wherein the second charge circuit comprises the first transistor connected to the power terminal and a second sensing node and the second transistor connected to the first sensing node and the second sensing node.

8. The memory device of claim 7, wherein the memory device further comprises:

a control logic circuit configured to:

in the first charge stage, apply the third voltage to the gate terminal of the clamp transistor to turn on the clamp transistor.

9. The memory device of claim 8, wherein the control logic circuit is further configured to:

in the second charge stage, apply the first pass voltage to the gate terminal of the first transistor to turn on the first transistor and apply the second pass voltage to the gate terminal of the second transistor to turn on the second transistor.

10. The memory device of claim 9, wherein the control logic circuit is further configured to:

in the first charge stage, apply the second pass voltage to the gate terminal of the second transistor to turn on the second transistor, and charge the second sensing node to the first voltage; and in the second charge stage, charge the second sensing node from the first voltage to the second voltage.

11. The memory device of claim 9, wherein the control logic circuit is further configured to:

in the first charge stage, apply a fourth voltage to the gate terminal of the first transistor to turn off the first transistor.

12. The memory device of claim 9, wherein the first charge circuit comprise a third transistor, wherein a first terminal of the third transistor is connected to the power terminal, and a second terminal of the third transistor is connected to the first terminal of the first transistor and the first terminal of the clamp transistor, and the control logic circuit is further configured to:

in the first charge stage and the second charge stage, apply a third pass voltage to a gate terminal of the third transistor to turn on the third transistor.

13. The memory device of claim 8, wherein the control logic circuit is further configured to:

in the second charge stage, continue to apply the third voltage to the gate terminal of the clamp transistor.

14. The memory device of claim 8, wherein the second charge circuit comprises:

a fourth transistor, wherein a first terminal and a second terminal of the fourth transistor are connected to the first sensing node and a first terminal of a fifth transistor respectively; and the fifth transistor, wherein a second terminal of the fifth transistor is connected to the bit line, and the control logic circuit is further configured to:

in the first charge stage and the second charge stage, apply a ramp voltage to a gate terminal of the fourth transistor until the ramp voltage rises to a fourth pass voltage; and in the first charge stage and the second charge stage, apply a fifth pass voltage to a gate terminal of the fifth transistor to turn on the fifth transistor.

15. A memory system, comprising:

at least one memory device, wherein the memory device comprises:

a memory array; and a page buffer circuit coupled to a bit line in the memory array, wherein the page buffer circuit comprises:

a first charge circuit, wherein a first terminal and a second terminal of the first charge circuit are connected to a power terminal and a first sensing node respectively, and the first charge circuit is configured to:

in a first charge stage, charge the first sensing node to a first voltage by applying a third voltage to a gate terminal of a clamp transistor to turn on the clamp transistor, wherein the first charge circuit comprises the clamp transistor connected to a power terminal and the first sensing node; and a second charge circuit coupled to the first sensing node along with the first charge circuit, wherein a first terminal and a second terminal of the second charge circuit are connected to the power terminal and the bit line respectively, and the second charge circuit is configured to:

in a second charge stage, charge the first sensing node and the bit line to a second voltage by applying a first pass voltage to a gate terminal of a first transistor to turn on the first transistor and applying a second pass voltage to a gate terminal of a second transistor to turn on the second transistor, wherein the second voltage is higher than the first voltage, and wherein the second charge circuit comprises the first transistor connected to the power terminal and a second sensing node and the second transistor connected to the first sensing node and the second sensing node; and a controller coupled with the at least one memory device and configured to control the memory device.

16. The memory system of claim 15, wherein the memory device further comprises:

a control logic circuit configured to:

in the first charge stage, apply the third voltage to the gate terminal of the clamp transistor to turn on the clamp transistor.

17. The memory system of claim 16, wherein the control logic circuit is further configured to:

in the second charge stage, apply the first pass voltage to the gate terminal of the first transistor to turn on the first transistor and apply the second pass voltage to the gate terminal of the second transistor to turn on the second transistor.

18. The memory system of claim 17, wherein the control logic circuit is further configured to:

in the first charge stage, apply the second pass voltage to the gate terminal of the second transistor to turn on the second transistor, and charge the second sensing node to the first voltage; and in the second charge stage, charge the second sensing node from the first voltage to the second voltage.

* * * * *